（12）United States Patent
Dong et al.

(10) Patent No.: US 10,698,278 B2
(45) Date of Patent: Jun. 30, 2020

(54) ARRAY SUBSTRATE, DISPLAY PANEL, AND DISPLAY APPARATUS WITH FLICKERING REDUCTION

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Zhifu Dong, Beijing (CN); Wei Xue, Beijing (CN); Hongmin Li, Beijing (CN); Liqing Liao, Beijing (CN)

(73) Assignees: BOE TECHNOLOGY GROUP CO., LTD., Beijing (CN); HEFEI BOE OPTOELECTRONICS TECHNOLOGY CO., LTD., Hefei (CN)

( * ) Notice: Subject to any disclaimer, the term of this patent is extended or adjusted under 35 U.S.C. 154(b) by 45 days.

(21) Appl. No.: 15/847,563

(22) Filed: Dec. 19, 2017

(65) Prior Publication Data

US 2018/0314124 A1 Nov. 1, 2018

(30) Foreign Application Priority Data

Apr. 27, 2017 (CN) .......................... 2017 1 0287722

(51) Int. Cl.
*G02F 1/1362* (2006.01)
*G02F 1/1337* (2006.01)
(Continued)

(52) U.S. Cl.
CPC ...... *G02F 1/136286* (2013.01); *G02F 1/1368* (2013.01); *H01L 29/458* (2013.01);
(Continued)

(58) Field of Classification Search
CPC ............. G02F 1/136286; G02F 1/1368; G02F 1/13624; G02F 2001/13606
See application file for complete search history.

(56) References Cited

U.S. PATENT DOCUMENTS

2001/0019383 A1\* 9/2001 Shin .................. G02F 1/133514
349/106
2008/0007676 A1\* 1/2008 Chang .................. G02F 1/1343
349/106
(Continued)

*Primary Examiner* — Allen L Parker
*Assistant Examiner* — Gustavo G Ramallo
(74) *Attorney, Agent, or Firm* — Foley & Lardner LLP

(57) ABSTRACT

The embodiments of the present disclosure provide an array substrate, display panel and display apparatus. The array substrate comprises a plurality of gate lines extending in a row direction; a plurality of data lines extending in a column direction; and an array comprising a plurality of pixels. Each column of pixels of the plurality of pixels are coupled to two data lines of the plurality of data lines, the two data lines are configured to provide same data signal for displaying an image to the column of pixels, a first data line of the two data lines and a second data line of the two data lines are arranged at both sides of the column of pixels along the row direction, respectively. The array substrate, display panel and display apparatus according to the embodiments of the present disclosure can greatly reduce coupling capacitance between a pixel electrode and a data line, thereby an effect of reducing crosstalk can be achieved.

10 Claims, 6 Drawing Sheets

(51) Int. Cl.
  *G02F 1/1368* (2006.01)
  *H01L 29/45* (2006.01)
  *H01L 27/12* (2006.01)
  *G02F 1/136* (2006.01)
(52) U.S. Cl.
  CPC .... *G02F 1/13624* (2013.01); *G02F 1/133707* (2013.01); *G02F 2001/13606* (2013.01); *H01L 27/124* (2013.01)

(56) References Cited

U.S. PATENT DOCUMENTS

2014/0160416 A1* 6/2014 Wang ................ G02F 1/134363
  349/139
2014/0291686 A1* 10/2014 Wang ................... H01L 27/124
  257/59

* cited by examiner

ARRAY SUBSTRATE, DISPLAY PANEL, AND DISPLAY APPARATUS WITH FLICKERING REDUCTION

CROSS-REFERENCE TO RELATED APPLICATION

This application claims priority to Chinese Patent Application No. 201710287722.3, filed on Apr. 27, 2017, which is hereby incorporated by reference in its entirety.

FIELD OF THE DISCLOSURE

The embodiments of the present disclosure relate to the technical field of displaying, particularly to an array substrate, display panel and display apparatus.

BACKGROUND

A liquid crystal display panel generally comprises an array substrate, a color film substrate and a liquid crystal layer sandwiched between the array substrate and the color film substrate. Since elements for controlling the display of the liquid crystal layer are mainly formed on the array substrate, the performance of the array substrate has an important influence on the display performance of the liquid crystal display panel. Thin film transistors (TFTs) are widely used in array substrates due to their advantages such as low power consumption, suitable for large scale integration, etc.

SUMMARY

The embodiments of the present disclosure provide an array substrate, display panel and display apparatus.

According to a first aspect of this disclosure, an array substrate is provided. The array substrate comprises a plurality of gate lines extending in a row direction; a plurality of data lines extending in a column direction; and an array comprising a plurality of pixels, wherein each column of pixels from the plurality of pixels are coupled to two data lines of the plurality of data lines, the two data lines are configured to provide same data signal for displaying an image to the column of pixels, a first data line of the two data lines and a second data line of the two data lines are arranged at both sides of the column of pixels along the row direction, respectively.

In one embodiment of the present disclosure, within a region between two adjacent pixels of each column of pixels, at least one of the first data line and the second data line has a recessed portion recessed towards inside of the region.

In one embodiment of the present disclosure, the pixel further comprises an electrode lead and a thin film transistor located between the first data line and second data line, wherein the electrode lead is electrically isolated from the first data line and second data line. A gate electrode of the thin film transistor includes a part of one of the plurality of gate lines coupled to the pixel; the active layer of the thin film transistor overlaps with the electrode lead of the pixel and the two data lines coupled to the pixel, in a direction of orthographic projection on the array substrate. The first data line and the second data line overlap with the active layer at a first overlapping portion and a second overlapping portion, respectively, the first overlapping portion and the second overlapping portion constitute together one of the source electrode and the drain electrode of the thin film transistor, the electrode lead overlaps with the active layer at a third overlapping portion in the direction of orthographic projection on the array substrate, the third overlapping portion constitutes the other one of the source electrode and the drain electrode of the thin film transistor, and the pixel also includes a pixel electrode, the electrode lead of the pixel electrode is further electrically connected to the pixel electrode of the pixel.

In one embodiment of the present disclosure, within a region between two adjacent pixels of each column of pixels, the array substrate further comprises a connecting wire electrically connecting the first data line and the second data line.

In one embodiment of the present disclosure, the connecting wire extends along the row direction, and is opposite to and separated from the electrode lead in the column direction.

In one embodiment of the present disclosure, the connecting wire, the first data line and the second data line are disposed in the same layer and are made of the same material.

In one embodiment of the present disclosure, a size of the third overlapping portion of the electrode lead in the column direction is equal to a size of the active layer in the column direction.

In one embodiment of the present disclosure, the connecting wire partially overlaps with the active layer in the direction of orthographic projection on the array substrate, and a size of the third overlapping portion of the electrode lead in the column direction is less a the size of the active layer in the column direction.

In one embodiment of the present disclosure, a distance from the third overlapping portion of the electrode lead to the first overlapping portion of the first data line in the row direction is equal to a distance from the third overlapping portion to the second overlapping portion of the second data line in the row direction.

According to a second aspect of this disclosure, a display panel comprising an array substrate is provided. The array substrate comprises a plurality of gate lines extending in a row direction; a plurality of data lines extending in a column direction; and an array comprising a plurality of pixels. Each column of pixels from the plurality of pixels are coupled to two data lines of the plurality of data lines, the two data lines are configured to provide same data signal to the column of pixels, a first data line of the two data lines and a second data line of the two data lines are arranged at both sides of the column of pixels along the row direction, respectively.

According to a third aspect of this disclosure, a display apparatus comprising a display panel is provided. The display panel comprises an array substrate. The array substrate comprises a plurality of gate lines extending in a row direction; a plurality of data lines extending in a column direction; and an array comprising a plurality of pixels. Each column of pixels from the plurality of pixels are coupled to two data lines of the plurality of data lines, the two data lines are configured to provide same data signal to the column of pixels, a first data line of the two data lines and a second data line of the two data lines are arranged at both sides of the column of pixels along the row direction, respectively.

BRIEF DESCRIPTION OF THE DRAWINGS

For a more clear illustration of the technical solutions of the embodiments of the present disclosure, the drawings of the embodiments will be briefly introduced below. Apparently, the schematic diagrams in the following drawings are not necessarily drawn to scale, but present various features in a simplified way. Further, the drawings in the description below merely involve some embodiments of the present disclosure, and are not intended to limit the present disclosure.

DETAILED DESCRIPTION

In order to make the objectives, technical schemes and advantages of the embodiments of the present disclosure clearer, a clear and complete description will be given below for the technical solutions of the embodiments of the present disclosure with reference to the drawings of the embodiments of the present disclosure. Obviously, embodiments described are only a part of embodiments of the present disclosure, and are not all of the embodiments. All other embodiments obtained by persons of ordinary skill in the art based on the described embodiments of the present disclosure without creative efforts shall fall within the protection scope of the present disclosure.

Unless otherwise defined, all terms (including technical and scientific terms) used herein have the same meanings as commonly understood by one of ordinary skill in the art to which the subject matters of the disclosure belong. It will be understood that the terms defined in the commonly used dictionaries should be interpreted to be consistent with their meanings in the context of the specification and related art and will not be interpreted in an idealized form unless otherwise explicitly defined herein. As used herein, a statement that two or more parts are "connected" or "coupled" together means that these parts are directly joined together or joined by one or more intermediate parts. In addition, terms such as "first" and "second" are used only to distinguish one component from another.

Figure 1:
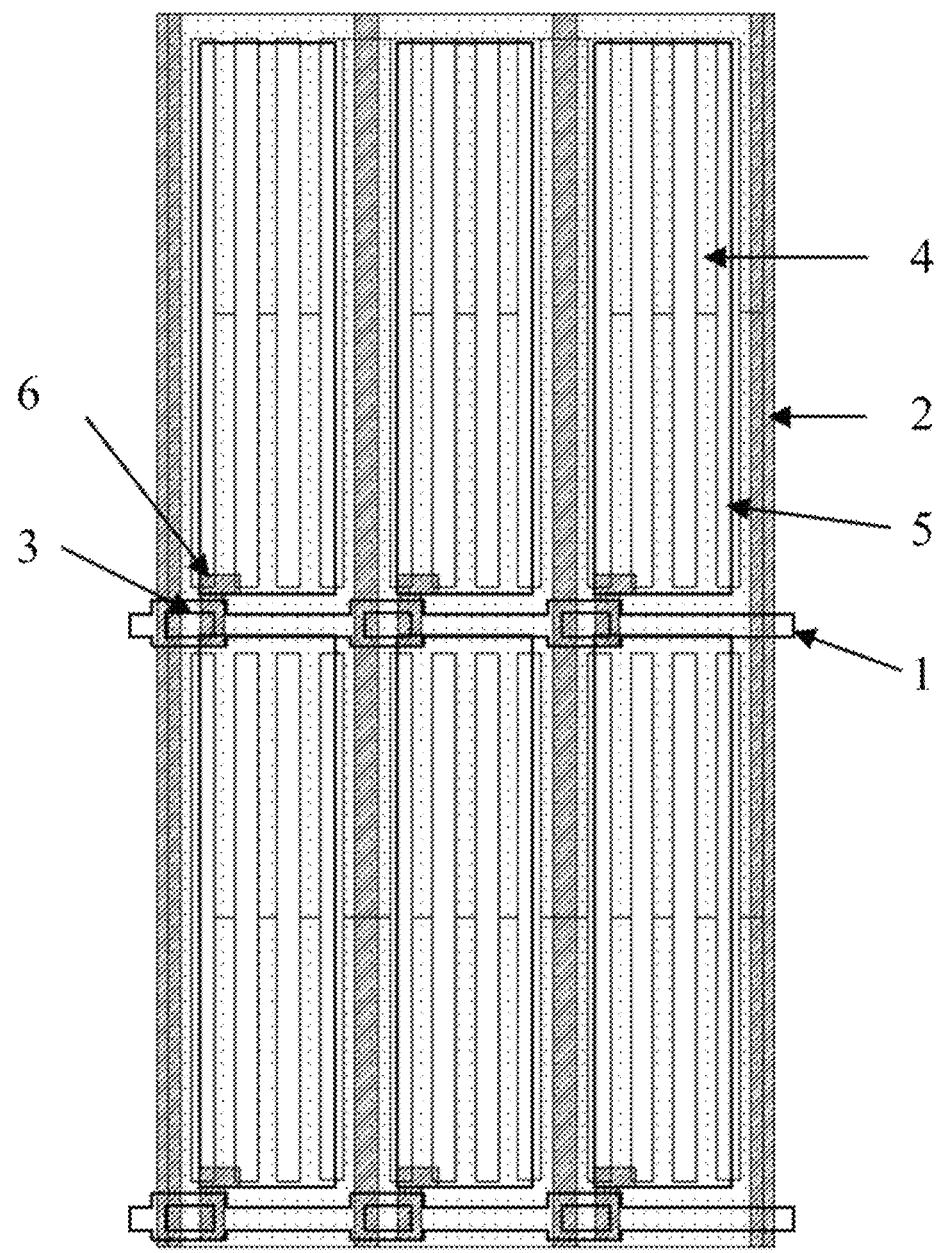
FIG. 1 is a top view showing the structure of a TFT array substrate.
Figure 2:
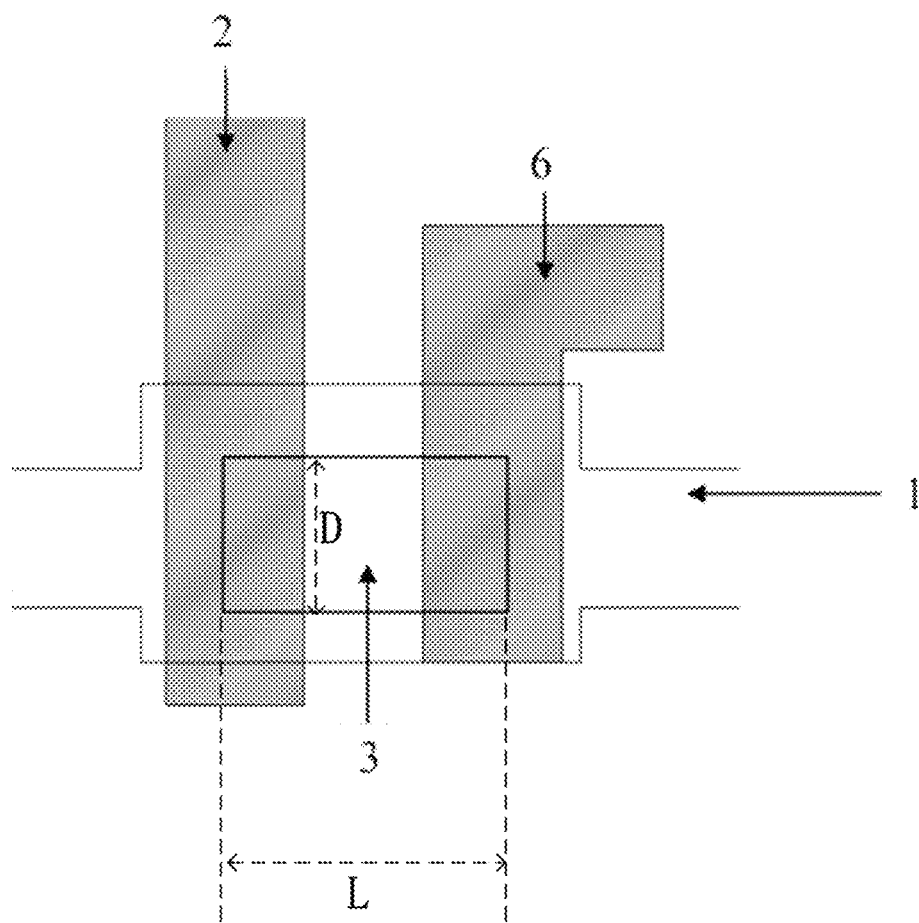
FIG. 2 is a partial enlarged diagram of the TFT array substrate shown in FIG. 1.

FIGS. 1 and 2 are a structural top view and a partial enlarged view of a TFT array substrate, respectively. As shown in the figures, the array substrate comprises a plurality of gate lines 1 extending in a row direction and a plurality of data lines 2 extending in a column direction. The intersections between the gate lines 1 and the data lines 2 define a plurality of pixels. These pixels form an array. Each pixel may be, for example, a green pixel, a red pixel or a blue pixel. A pixel electrode 5 is provided in each pixel. As for the pixel in the upper left corner of FIG. 1, its corresponding TFT comprises an active layer 3. An overlapping portion where the data line 2 overlaps with the active layer 3 constitutes one of the source electrode and the drain electrode of the TFT (for example, the source electrode). An overlapping portion where the active layer 3 overlaps with the electrode lead 6 constitutes the other one of the source electrode and the drain electrode of the TFT (for example, the drain electrode), wherein the electrode lead 6 is used to electrically connect a corresponding terminal (for example, the drain electrode) of the TFT to a pixel electrode 5. The gate electrode of the TFT includes a corresponding gate line 1. Further, the TFT array substrate also comprises a common electrode layer 4 for forming storage capacitance with the pixel electrode 5. However, an array substrate having the structure shown in FIGS. 1 and 2 may sometimes suffer from a flicker problem in image displaying. Thus, it is desired to improve the performance of the array substrate. In view of the above problem, the inventor of the present application has found that, with respect to the TFT array substrate shown in FIGS. 1 and 2, in the display mode of column inversion, due to the opposite polarities of two adjacent data lines 2 and coupling capacitance existed between the pixel electrode 5 and an adjacent data line 2, a larger voltage difference between the pixel electrode 5 and the adjacent data line 2 may cause relatively larger coupling capacitance therebetween, which has a great impact on crosstalk. Besides, there is also capacitance between the source electrode/drain electrode and the gate electrode of the TFT described above. After the charging of the pixels is complete and the TFT is switched off, the pixel capacitance may be changed by this capacitance, and thereby the display brightness will be changed, causing the display to flicker from the macroscopic view.

Figure 3:
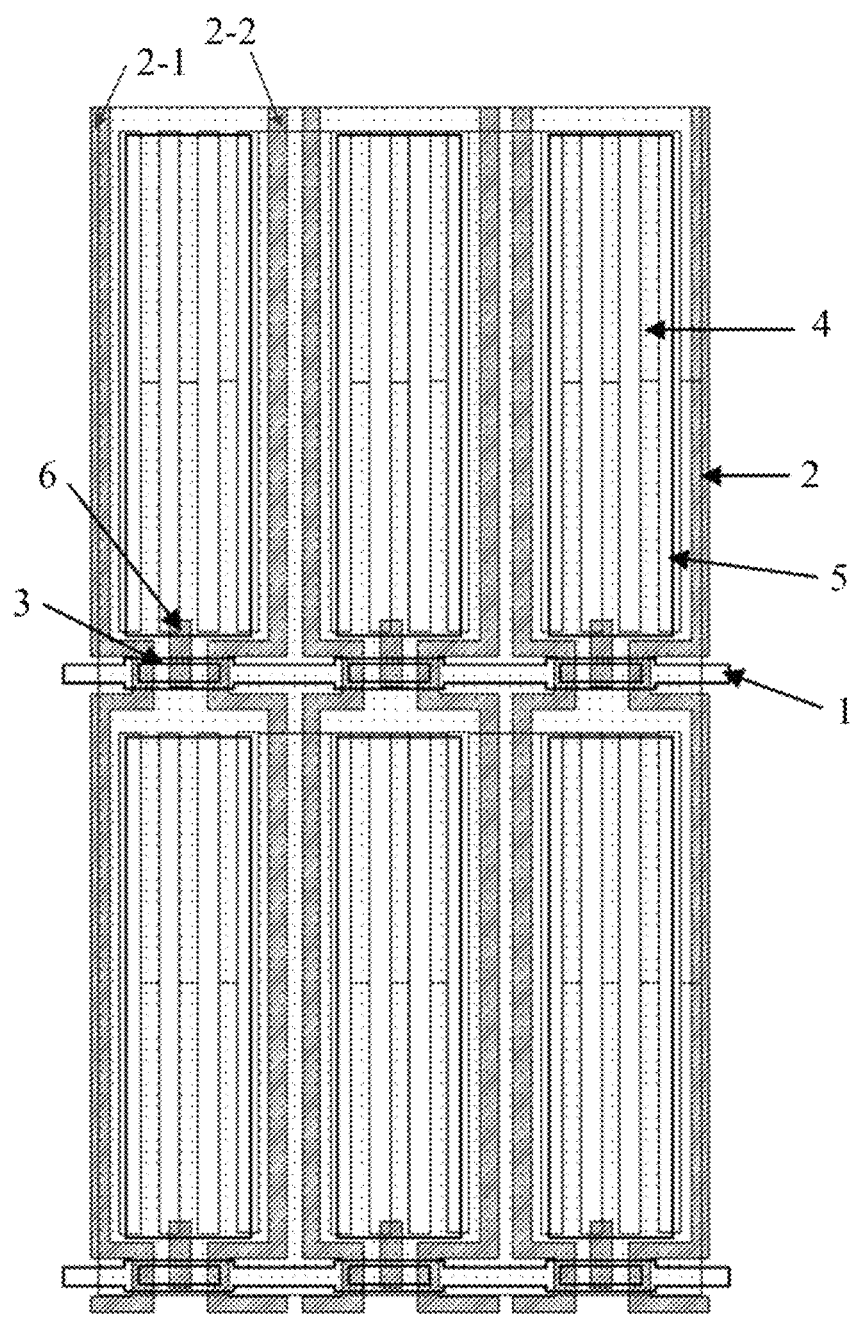
FIG. 3 is a top view showing the structure of the array substrate according to an embodiment of the present disclosure.

FIG. 3 is a top view showing the structure of the array substrate according to an embodiment of the present disclosure. As shown in the figure, the array substrate comprises a plurality of gate lines 1 extending in a row direction, a plurality of data lines 2 extending in a column direction, and an array of pixels defined by the intersections between the gate lines 1 and the data lines 2. A pixel electrode 5 is provided in each pixel. Each column of pixels are correspondingly connected to two data lines, i.e. a first data line 2-1 and a second data line 2-2, which are arranged at two sides of the column of pixels along the row direction, respectively. The first data line 2-1 and the second data line 2-2 are used to provide the same data signal for image displaying to the pixel electrodes of the column of pixels. In this way, two data lines are disposed between two adjacent columns of pixels, and the two data lines provide data signals to corresponding pixel electrodes of the two columns of pixels, respectively.

As shown in the figure, within a region between a first and a second pixels that are adjacent of one column of pixels (for example, a region between two vertically adjacent pixels of the leftmost column of pixels), the first data line 2-1 and the second data line 2-2 have recessed portions recessed towards inside of the region, respectively. It should be noticed that the embodiments of the present disclosure are not limited thereto. As another example, one of the first data line 2-1 and the second data line 2-2 has a recessed portion recessed towards inside of the region, and the other one does not have a recessed portion (i.e., extends in a straight line along the column direction). As another example, none of the first data line 2-1 and the second data line 2-2 has a recessed portion.

Figure 4:
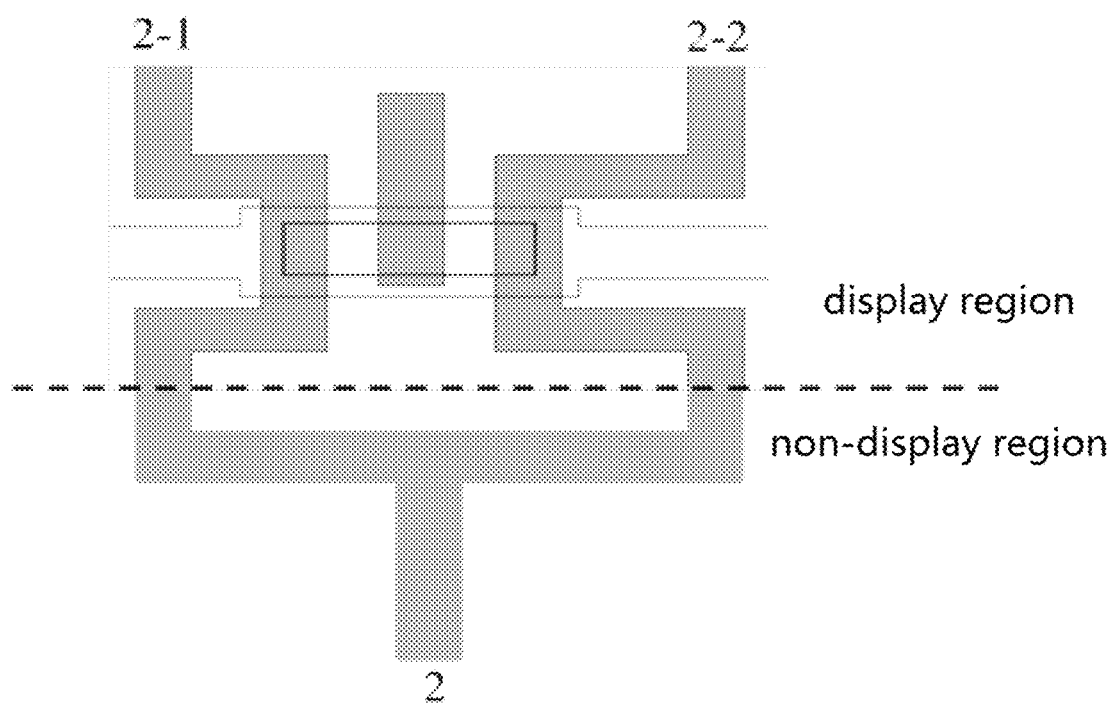
FIG. 4 is a partial enlarged diagram showing the array substrate of FIG. 3 at the periphery of the display region.

FIG. 4 is a partial enlarged diagram of the array substrate shown in FIG. 3 at the periphery of a display region, which shows a display region having pixels and a non-display region that does not have pixels surrounding the display region. As shown in the figure, the first data line 2-1 and the second data line 2-2 are merged into one data line 2 in the non-display region of the array substrate. In other words, one data line 2 is branched into two columns of data lines, i.e., a first data line 2-1 and a second data line 2-2. In this way, for one column of pixels, two data lines provide data signals to the column of pixels simultaneously. It should be noticed that the branching position of the data line 2 is not limited to be in the non-display region. The data line 2 can also branch in the display region immediately adjacent to the periphery of the display region.

In an array substrate according to the embodiments of the present disclosure, because the data line adjacent to a pixel electrode has the same polarity with the pixel electrode itself, coupling capacitance between the pixel electrode and the data line can be greatly reduced, thereby an effect of reducing crosstalk can be achieved.

Figure 5:
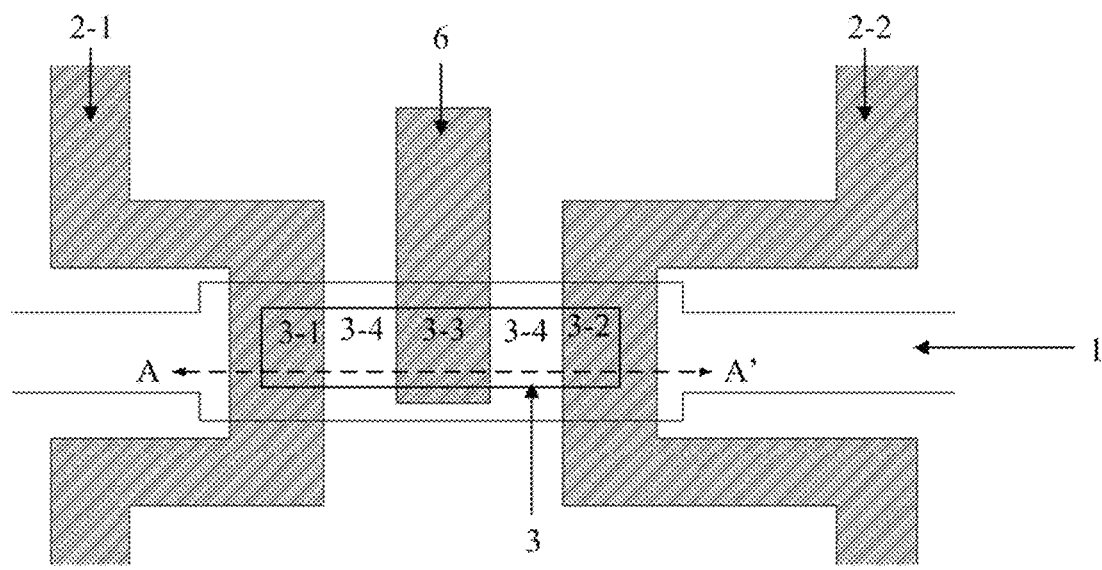
FIG. 5 is a partial enlarged diagram showing the array substrate of FIG. 3 in the display region.

FIG. 5 is a partial enlarged diagram showing the array substrate of FIG. 3 in the display region. As shown in FIGS. 3 and 5, with respect to a first pixel (for example, a pixel in the upper left corner in FIG. 3) of a column of pixels, it comprises a electrode lead 6 located between the first data line and second data line and electrically isolated from the first data line and second data line, which is used to connect the TFT of the first pixel to the pixel electrode 5. The orthographic projection of the gate electrode of the TFT on the array substrate is within the orthographic projection of a corresponding gate line 1 on the array substrate. That is to say, the gate electrode of the TFT may be formed by a portion of the gate line. The active layer of the TFT is insulated from the gate line 1 in the orthographic projection direction on the array substrate and overlaps with the gate line 1. A first overlapping portion 3-1 and a second overlapping portion 3-2, where the first data line 2-1 and the second data line 2-2 overlap with the active layer 3 respectively, constitute together one of the source electrode and the drain electrode of the TFT (for example, the source electrode). A third overlapping portion 3-3 where the electrode lead 6 overlaps with the active layer 3 constitutes the other one of the source electrode and the drain electrode of the TFT (for example, the drain electrode). A corresponding one of the source electrode and the drain electrode of the TFT (for example, the drain electrode, in this case, the electrode lead 6 is used as a drain electrode lead) is electrically connected to the pixel electrode 5 of the first pixel via the electrode lead 6. Thus, when the TFT is switched on, data signals transmitted over the data line 2 may be transmitted to the pixel electrode 5 through the TFT and the electrode lead 6.

The above arrangement method is equivalent to arranging two sub-TFTs for a pixel, i.e., two sub-TFTs supplying power to a pixel. Therefore, in the case where the sum of the currents supplied from the two sub-TFTs is equal to the current supplied by a TFT shown in FIG. 1 or FIG. 2, the width-to-length ratio of the channel region of each sub-TFT is half of the width-to-length ratio of the channel region of the TFT shown in FIG. 1 or FIG. 2. Thereby, in the case of an unchanged channel length, the width of the channel region of each sub-TFT is reduced compared with the width of the channel region of the TFT shown in FIGS. 1 and 2. Accordingly, the size of the active layer 3 in the column direction of the embodiment of the present disclosure can be reduced compared to the size of the active layer 3 of the TFT shown in FIGS. 1 and 2 in the column direction. For example, in FIG. 3, the size of the third overlapping portion in the column direction where the electrode lead 6 overlaps with the active layer 3 is equal to the size of the active layer 3 in the column direction. That is, the orthographic projection of the electrode lead 6 on the array substrate extends across the orthographic projection of the active layer 3 on the array substrate in the column direction. The size of the active layer 3 in the column direction may be half of the size of the active layer 3 of the TFT shown in FIGS. 1 and 2 in the column direction. For example, the size of the active layer 3 in the column direction in FIG. 2 may be in a range of 25 μm-15 μm (such as 20 μm), and the size of the active layer 3 in the column direction in FIG. 5 may be reduced to a range of 12 μm-7 μm (such as 10 μm). Usually, the size of the gate line 1 in the column direction is substantially the same or close to the size of the active layer 3 in the column direction. Thus, the array substrate according to the embodiments of the present disclosure can reduce the overlapping area between the gate electrode and the electrode lead (for example, the drain electrode), so that capacitance therebetween can be reduced. Since the degree of the impact on the pixel capacitance and the degree of image flicker when the TFT is switched off depend on the magnitude of this capacitance, the array substrate according to the embodiments of the present disclosure can reduce image flicker through reducing this capacitance.

As a skilled person may understand, a length of a channel region refers to the distance between the source electrode and the drain electrode. As shown in FIG. 2, the length L is the distance between the data line 2 and the electrode lead 6. In FIG. 2, length L is along the row direction. A width D of the channel region refers to the size of the channel region along a column direction. The column direction refers to a direction that perpendicular to the row direction.

In FIG. 3, the distance from the third overlapping portion 3-3 to the first overlapping portion 3-1 in the row direction is equal to the distance from the third overlapping portion 3-3 to the second overlapping portion 3-2. In this way, it is convenient to check wiring errors in industrial implementations. However, it should be noticed that the embodiments of the present disclosure are not limited thereto. As another example, the distance from the third overlapping portion to the first overlapping portion in the row direction may be not equal to the distance from the third overlapping portion to the second overlapping portion.

Figure 6:
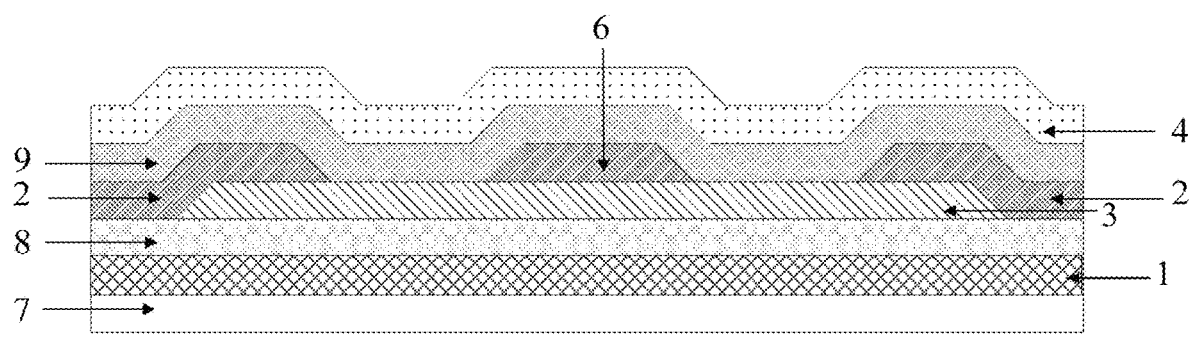
FIG. 6 is a cross section view of the array substrate shown in FIG. 4.

FIG. 6 is a cross section view of the array substrate shown in FIG. 5 taken along the AA' direction. As shown in FIG. 5, the array substrate comprises, from bottom to top, a substrate 7, a gate line 1 formed on the substrate 7, a gate insulating layer 8 formed on the gate line 1, an active layer 3 formed on the gate insulating layer, a data line 2 and an electrode lead 6 formed on the active layer 3, an insulating layer 9 formed on the data line 2 and the electrode lead 6, and a common electrode layer 4 formed on the insulating layer 9. It should be understood that, although the TFT shown in FIG. 6 is a bottom gate structure, the present disclosure is also applicable to a TFT having a top gate structure. Further, the constituent materials of the components described above may be the same as those of the existing array substrates, and the embodiments of the present disclosure are not particularly limited in this respect.

A method for manufacturing the array substrate according to the embodiment described above comprises the following steps. At first, in a first step, gate lines extending along the row direction are formed on the substrate. Then, in a second step, a gate insulating layer is formed on the gate lines. Next, in a third step, an active layer is formed on the gate insulating layer, so that the active layer overlaps with the gate lines in the orthographic projection direction on the substrate. Then, in a fourth step, data lines and electrode leads extending in the column direction are formed on the active layer, so that the formed data lines and the electrode leads have an arrangement relationship with the active layer as described above with reference to FIGS. 3-5. The third and fourth steps can be performed by using corresponding masks that are designed and prepared in advance, so that the formed TFTs have a predetermined width-to-length ratio meeting the requirement of pixel driving. As for the first step and second step, they can be performed using existing processes, which will not be described in detail herein. Further, the insulating layer (insulating layer 9 in FIG. 6) formed on the data lines and electrode leads, the common electrode layer (common electrode layer 4 in FIG. 6) formed on the insulating layer and the pixel electrodes 5 may be the same as those of existing array substrates and can be formed using existing processes. The present disclosure is not particularly limited in this respect.

In this way, in the manufacturing of the array substrates according to the embodiments of the present disclosure, it is only required to replace or modify the mask for forming the active layer and the mask for forming the data lines and the electrode leads, and there is no need to provide additional masks and processes.

According to the above description, at least one embodiment of the present disclosure provides an array substrate comprising a plurality of gate lines extending in a row direction; a plurality of data lines extending in a column direction; and an array comprising a plurality of pixels. Each column of pixels from the plurality of pixels is coupled to two data lines of the plurality of data lines, the two data lines are configured to provide same data signal for displaying an image to the column of pixels, a first data line of the two data lines and a second data line of the two data lines are arranged at both sides of the column of pixels along the row direction, respectively.

Figure 7:
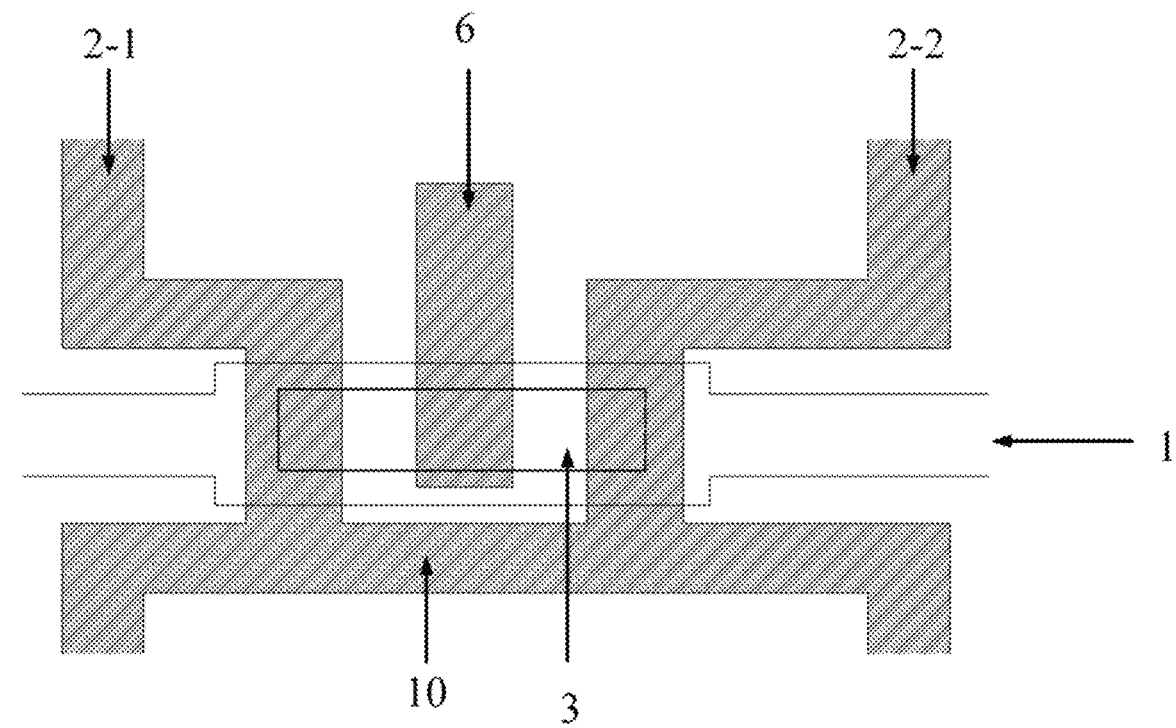
FIG. 7 is a partial enlarged diagram of an array substrate according to an embodiment of the present disclosure.

FIG. 7 is a partial enlarged diagram of an array substrate according to an embodiment of the present disclosure. This embodiment differs from the embodiment of FIG. 3 in that the first data line 2-1 is electrically connected to the second data line 202 via a connecting wire 10. The connecting wire 10 is disposed along the row direction, and is opposite to and separated from the electrode lead 6 in the column direction, and the connecting wire 10 does not overlap with the active layer 3. The connecting wire 10 may be formed of the same material as the data line 2 and disposed in the same layer as the data line 2. The size of the third overlapping portion in the column direction where the electrode lead 6 overlaps with the active layer 3 is equal to the size of the active layer 3 in the column direction. According to the array substrate of this embodiment, the resistance of the data line can be reduced, so that power consumption can be reduced when the current is fixed.

Figure 8:
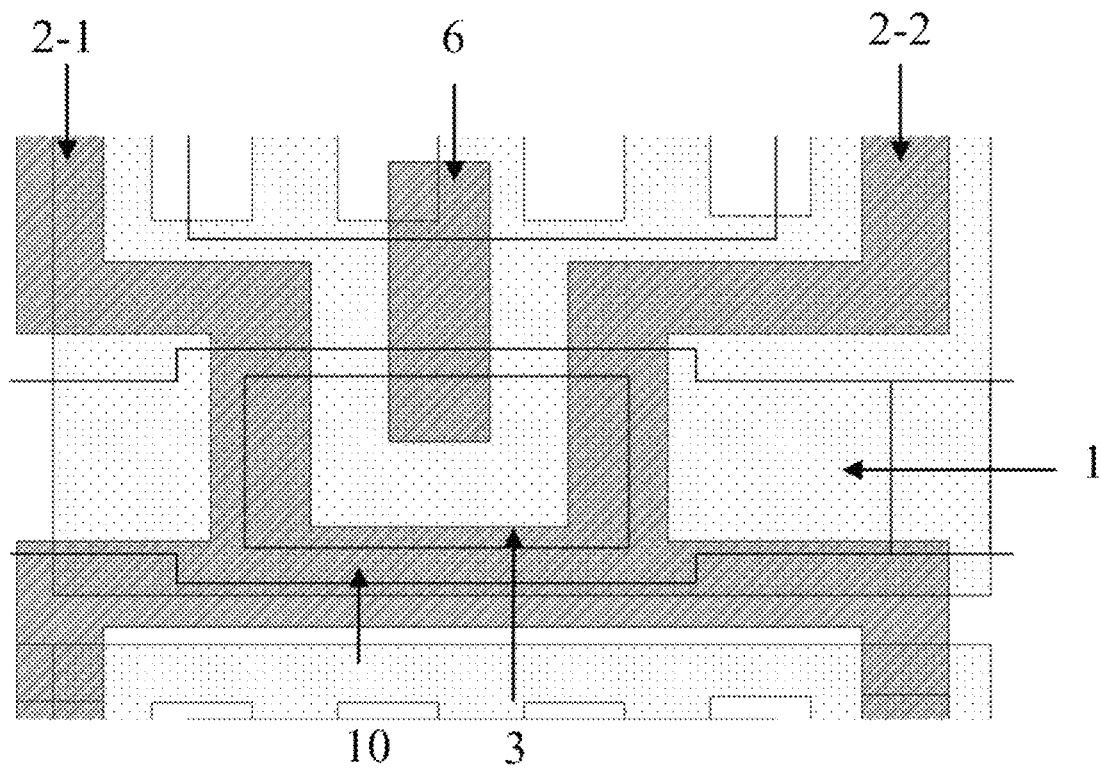
FIG. 8 is a partial enlarged diagram of an array substrate according to an embodiment of the present disclosure.

FIG. 8 is a partial enlarged diagram of an array substrate according to an embodiment of the present disclosure. This embodiment differs from the embodiment of FIG. 7 in that the connecting wire 10 partially overlaps with the active layer 3, and the size of the third overlapping portion in the column direction where the electrode lead 6 overlaps with the active layer 3 is less than the size of the active layer 3 in the column direction. Similar to the embodiment of FIG. 7, the connecting wire 10 may be formed of the same material as the data line 2 and disposed in the same layer as the data line 2.

In the array substrate according to this embodiment, since the connecting wire 10 partially overlaps with the active layer 3, it is equivalent to a TFT with a U-shaped channel region that is formed by two sub-TFTs. Because the width of the channel region is increased in the row direction, in the case of the same width of the channel region as the TFT shown in FIG. 5 or 7, the width of the channel region in the column direction can be reduced. Thus, in the case of the same width-to-length ratio, the array substrate according to this embodiment can further reduce the overlapping area between the gate electrode and the electrode lead 6 (for example, the drain electrode lead), so that capacitance therebetween can be reduced, resulting in a further improvement in image flicker.

The array substrates according to the embodiments of the present disclosure have been described above. Correspondingly, one embodiment of the present disclosure further provides a display panel comprising the array substrate described above. Besides, one embodiment of the present disclosure further provides a display apparatus comprising the display panel. The display apparatus according to the embodiments of the present disclosure can be used in any product having a display function, such as mobile phones, tablet computers, televisions, laptops, digital photo frames or navigators, etc. Because both of the display panel and the display apparatus comprise the array substrate described above, they can also achieve the same advantageous effects as the array substrate, which will not be repeated herein.

It should be noticed that various aspects of this application may be implemented individually or in combination with one or more other aspects. Furthermore, the detailed description and specific embodiments are intended for purposes of illustration only and are not intended to limit the scope of the disclosure.

What described above is only exemplary embodiments of the present disclosure and are not intended to limit the protection scope of the present disclosure. The protection scope of the disclosure is defined by the appended claims.

We claim:

1. An array substrate, comprising
a plurality of gate lines extending in a row direction;
a plurality of data lines extending in a column direction; and
an array comprising a plurality of pixels,
wherein each column of pixels from the plurality of pixels are coupled to two data lines of the plurality of data lines, the two data lines are configured to provide same data signal to the column of pixels, a first data line of the two data lines and a second data line of the two data lines are arranged at both sides of the column of pixels along the row direction, respectively,
there is a region between two adjacent pixels of each column of pixels, at least one of the first data line and the second data line has a recessed portion recessed towards inside of the region.

2. The array substrate according to claim 1, wherein each of the plurality of pixels further comprises an electrode lead and a thin film transistor located between the first data line and the second data line, the electrode lead is electrically isolated from the first data line and the second data line,
a gate electrode of the thin film transistor, the gate electrode comprising a part of one of the plurality of gate lines that is coupled to the pixel; an active layer of the thin film transistor overlaps with the electrode lead of the pixel and the two data lines coupled to the pixel, in a direction of orthographic projection on the array substrate,
the first data line and the second data line overlap with the active layer at a first overlapping portion and a second overlapping portion, respectively, the first overlapping portion and the second overlapping portion constitute together one of a source electrode and a drain electrode of the thin film transistor, the electrode lead overlaps with the active layer at a third overlapping portion in the direction of orthographic projection on the array substrate, the third overlapping portion constitutes the other one of the source electrode and the drain electrode of the thin film transistor, and the pixel further includes a pixel electrode, the electrode lead of the pixel electrode is further electrically connected to the pixel electrode of the pixel.

3. The array substrate according to claim 2, wherein, the array substrate further comprises a connecting wire electrically connecting the first data line and the second data line.

4. The array substrate according to claim 3, wherein the connecting wire extends along the row direction, and is opposite to and separated from the electrode lead in the column direction.

5. The array substrate according to claim 3, wherein the connecting wire, the first data line and the second data line are disposed in the same layer and are made of the same material.

6. The array substrate according to claim 3, wherein the connecting wire partially overlaps with the active layer in the direction of orthographic projection on the array substrate, and a size of the third overlapping portion of the electrode lead in the column direction is less than a size of the active layer in the column direction.

7. The array substrate according to claim 2, wherein a size of the third overlapping portion of the electrode lead in the column direction is equal to a size of the active layer in the column direction.

8. The array substrate according to claim 2, wherein a distance from the third overlapping portion of the electrode lead to the first overlapping portion of the first data line in the row direction is equal to a distance from the third overlapping portion to the second overlapping portion of the second data line in the row direction.

9. A display panel, comprising an array substrate, wherein the array substrate comprises:

a plurality of gate lines extending in a row direction;
a plurality of data lines extending in a column direction; and
an array comprising a plurality of pixels,
wherein each column of pixels from the plurality of pixels are coupled to two data lines of the plurality of data lines, the two data lines are configured to provide same data signal to the column of pixels, a first data line of the two data lines and a second data line of the two data lines are arranged at both sides of the column of pixels along the row direction, respectively,
there is a region between two adjacent pixels of each column of pixels, at least one of the first data line and the second data line has a recessed portion recessed towards inside of the region.

10. A display apparatus, comprising a display panel, wherein the display panel comprises an array substrate, and the array substrate comprises a plurality of gate lines extending in a row direction;
a plurality of data lines extending in a column direction; and
an array comprising a plurality of pixels,
wherein each column of pixels from the plurality of pixels are coupled to two data lines of the plurality of data lines, the two data lines are configured to provide same data signal to the column of pixels, a first data line of the two data lines and a second data line of the two data lines are arranged at both sides of the column of pixels along the row direction, respectively,
there is a region between two adjacent pixels of each column of pixels, at least one of the first data line and the second data line has a recessed portion recessed towards inside of the region.

* * * * *